(12) United States Patent
Nicolaï et al.

(10) Patent No.: US 6,225,572 B1
(45) Date of Patent: May 1, 2001

(54) CONNECTING AN ELECTRONIC CARD POINT TO A PRINTED CIRCUIT ON A METAL SUBSTRATE WITH A CAPSULE

(75) Inventors: Jean Marc Nicolaï, Courbevoie; Marc Duarte, Neuilly Plaisance, both of (FR)

(73) Assignee: Valeo Vision, Bobigny (FR)

( * ) Notice: Subject to any disclaimer, the term of this patent is extended or adjusted under 35 U.S.C. 154(b) by 0 days.

(21) Appl. No.: 09/403,966
(22) PCT Filed: Mar. 2, 1999
(86) PCT No.: PCT/FR99/00461
§ 371 Date: Nov. 1, 1999
§ 102(e) Date: Nov. 1, 1999
(87) PCT Pub. No.: WO99/45754
PCT Pub. Date: Sep. 10, 1999

(30) Foreign Application Priority Data

Mar. 2, 1998 (FR) .................................................. 98 02477

(51) Int. Cl.[7] ...................................................... H05K 1/16
(52) U.S. Cl. .............................. 174/260; 174/262; 439/84; 361/792
(58) Field of Search ...................................... 174/260, 262, 174/263, 264, 265; 361/748, 792, 719, 720; 439/78, 82, 84; 257/718, 719

(56) References Cited

U.S. PATENT DOCUMENTS 2,958,926 * 11/1960 Morison .
3,537,176 * 11/1970 Healy et al. .
4,649,461 * 3/1987 Matsuta .
5,416,278 * 5/1995 Ostrem et al. .

\* cited by examiner

*Primary Examiner*—Jeffrey Gaffin
*Assistant Examiner*—Kamand Cuneo
(74) *Attorney, Agent, or Firm*—Morgan & Finnegan LLP

(57) ABSTRACT

An assembly including a printed-circuit electronics card mounted on a metal substrate, and in electronic communication with the same, includes a capsule which is crimped into a cavity in the metal substrate and which extends through a hole in the electronics card, the edges of said hole being metallised, the capsule being soldered to the metallised area of the edges.

7 Claims, 1 Drawing Sheet

CONNECTING AN ELECTRONIC CARD POINT TO A PRINTED CIRCUIT ON A METAL SUBSTRATE WITH A CAPSULE

BACKGROUND OF THE INVENTION

The present invention relates to the connection of a point on an electronics card to a metal substrate which carries the said card.

At present, there are essentially three known techniques for making such a connection.

One of them consists of making a soldered joint using a solder paste deposited on that face of the card which is intended to be opposite the metal substrate, the latter having previously been treated with a finish which can be soldered (nickel, for example).

However, particularly because of the finishing treatment, this technique is expensive.

Another technique consists of using a rivet which passes through both the card and the metal substrate.

This technique is not satisfactory either. In particular, it does not allow an impervious connection and requires an additional step for forming a seal, which is formed by depositing an adhesive and polymerising, for example. Furthermore, carrying out this riveting requires two machining operations: one for piercing and the other for recessing the riveting hole.

Consequently, the number of additional operations required by the riveting technique makes this technique impracticable.

Finally, another technique consists in driving a metal pin into the substrate, this pin passing through the electronics card, the substrate having previously been machined to the dimensions of the said pin.

However, this technique also has drawbacks. In particular, it is not an easy matter to manipulate the pin, and the dimensions of the latter can be altered during manipulation. In addition, this technique requires a hole to be pierced with high precision, this hole not opening out in the substrate. Consequently, this technique is not simple to implement.

The connection techniques using metal pins or rivets also have other disadvantages common to them.

They require the electronics card to be placed under stress around the rivet or pin, which mechanically weakens the said card.

Moreover, the electrical contact—which is provided solely by the mechanical pressure itself—is not thereby very reliable.

Equally, the additional thicknesses of the rivet or of the pin on the electronics card prove to be inconvenient for the operations of mounting the SMD components.

BRIEF SUMMARY OF THE INVENTION

One aim of the invention is to propose a technique allowing an impervious electrical connection to be made between a point on an electronics card and the metal substrate which carries it, and which does not exhibit these various drawbacks.

To that end, the invention proposes an assembly comprising a printed-circuit electronics card mounted on a metal substrate, as well as means which connect the said card electrically to the said substrate, characterised in that the said means comprise a capsule which is crimped into a cavity of the metal substrate and which extends through a hole in the electronics card, the edges of the said hole being metallised, the said capsule being soldered to the metallised area of the said edges.

It also proposes a method for producing an assembly including a printed-circuit electronics card mounted on a metal substrate, as well as means which connect the said card electrically to the said substrate, characterised by the various steps below:

forming a cavity on the substrate by stamping;

fitting a capsule into the said cavity;

crimping the capsule, by stamping;

fitting the printed circuit to the substrate, by positioning over the capsule a hole formed in the printed circuit and the edges of which are metallised, depositing solder paste by screen printing, on the one hand at the various points on the printed circuit card where surface components have to be soldered and, on the other hand, at the hole and the capsule;

positioning the various components on the printed-circuit card;

brazing in order to solder, on the one hand, the surface components to the printed circuit and, on the other hand, the capsule to the metallised area of the edges of the hole in the printed-circuit card.

BRIEF DESCRIPTION OF THE DRAWINGS

Other characteristics and advantages of the invention will further emerge from the description below. This description is purely illustrative and is not limiting. It should be read with regard to the single attached FIGURE, which shows a diagrammatic sectional illustration of an assembly in accordance with an embodiment of the invention.

DETAILED DESCRIPTION OF THE INVENTION

Figure 1:
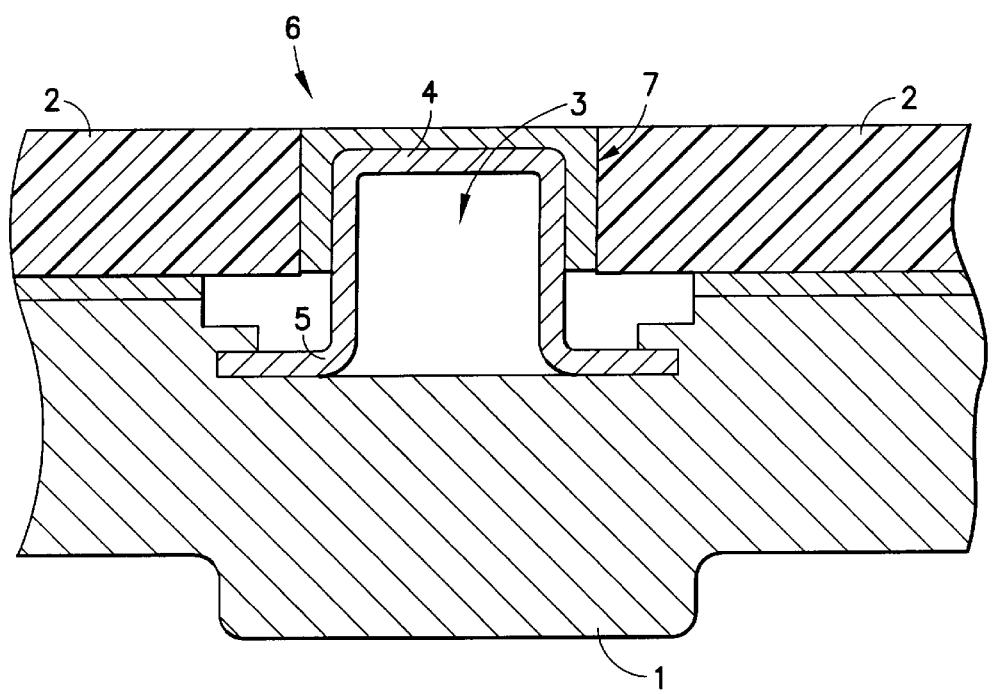

The assembly shown in this FIGURE comprises a metal substrate 1 and an electronics card 2.

On its face intended to be opposite the electronics card 2, the metal substrate 1 has a cavity 3 which is formed by stamping.

This cavity 3 accommodates a capsule 4 which has a rotational form, for example a generally cylindrical form, U-shaped in cross-section, and which has an outer annular rim 5 at its end opposite its bottom.

The said annular rim 5 is crimped into the bottom of the cavity 3.

The said capsule 4 extends through a hole 6 in the electronics card carried by the substrate 1.

The edges of this hole 6 have a metallised area 7 which is soldered to the capsule 4 by brazing.

Such an assembly is produced by implementing the various successive steps below:

forming the cavity 3 by stamping;

depositing the capsule 4 in the said cavity 3;

crimping the capsule 4, by stamping;

fitting the printed circuit 2 onto the substrate 1 by positioning the metallised hole 6 over the capsule 4;

depositing solder paste by screen printing, on the one hand at the various points on the card where surface components have to be soldered and, on the other hand, at the hole 6 and the capsule 4;

positioning the various components on the printed circuit 2;

brazing by solder reflow, on the one hand of the SMD components and, on the other hand, of the metallised area 7 and the capsule 4.

The said capsule 4 is made of a tinned steel which is galvanically compatible with that of the substrate.

The height of the capsule 4 and the depth of the cavity 3 are chosen so that the bottom of the capsule 4 does not protrude with respect to the electronics card 2.

As can be seen, the technique which has just been described provides an electrical connection to the substrate which, on the one hand, is impervious and, on the other hand, has the following advantages:

it does not require the metal substrate 1 to be perforated, and hence this substrate remains perfectly impervious;

the electrical contact between the capsule and the substrate is excellent;

assembly is simple, because this electrical contact is fitted in the same operation as that for assembling the surface-mount components on the electronics card 2;

equally, the substrate 1 equipped with the capsule 4 constitutes a mechanically stable subassembly; the same applies for that constituted by this subassembly and the electronics card, which can therefore be easily stored or manipulated prior to the various brazing steps.

Embodiments or implementations other than those just described may also be envisaged.

In particular, the capsule 4 may be of shapes other than the U-shape described, such as a truncated-conical shape, a U-shape or a spherical shape with several different diameters. The benefit of these various shapes lies in the increased feasibility of soldering while reducing the risks of the brazing alloy deposited on the metallised hole running during melting.

In a further variant, the capsule 4 may be of a piece with the substrate 1 and be produced by stamping.

What is claimed is:

1. An assembly comprising:

a printed-circuit electronics card mounted on a metal substrate; and a capsule electronically connecting the card to the substrate, the capsule being crimped into a cavity in the metal substrate and extending through a hole in the electronics card, the hole having at least one edge including a metallised area, and the capsule being soldered to the metallised area of the at least one edge.

2. An assembly according to claim 1, wherein the capsule has a rotational form.

3. An assembly according to claim 2, wherein the capsule comprises a generally cylindrical form having a U-shaped cross-section.

4. An assembly according to claim 2, wherein the capsule comprises a generally spherical form.

5. An assembly according to claim 2, wherein the capsule has a generally frustoconical form.

6. An assembly according to the claim 1, wherein the capsule is made of a tinned steel which is galvanically compatible with the substrate.

7. A method of producing an assembly comprising a printed-circuit electronics card mounted on a metal substrate, comprising the steps of:

forming a cavity on the substrate by stamping;

fitting a capsule into the said cavity;

crimping the capsule by stamping;

fitting the printed circuit onto the substrate, by positioning over the capsule a hole having edge portions which are metallised, said hole being in the printed circuit;

depositing solder on the printed circuit card at the hole and the capsule;

positioning components on the printed-circuit card;

brazing in order to solder said components to the printed circuit and the capsule to the metallised area of the edges of the hole in the printed-circuit card.

* * * * *